(12) United States Patent
Lee

(10) Patent No.: US 6,858,870 B2
(45) Date of Patent: Feb. 22, 2005

(54) MULTI-CHIP LIGHT EMITTING DIODE PACKAGE

(75) Inventor: Julian Lee, Taipei Hsien (TW)

(73) Assignee: Galaxy PCB Co., Ltd., Taoyuan Hsen (TW)

(*) Notice: Subject to any disclaimer, the term of this patent is extended or adjusted under 35 U.S.C. 154(b) by 0 days.

(21) Appl. No.: 10/458,940

(22) Filed: Jun. 10, 2003

(65) Prior Publication Data

US 2004/0251464 A1 Dec. 16, 2004

(51) Int. Cl.7 .......................... H01L 27/15; H01L 31/12; H01L 33/00
(52) U.S. Cl. .......................... 257/79; 257/99
(58) Field of Search ................. 257/79, 81, 82, 257/88, 99

(56) References Cited

U.S. PATENT DOCUMENTS 4,985,753 A * 1/1991 Fujioka et al. ............... 257/700
5,345,373 A * 9/1994 Tanida .......................... 362/455

* cited by examiner

Primary Examiner—Phuc T. Dang
(74) Attorney, Agent, or Firm—Pro-Techtor International Services

(57) ABSTRACT

A multi-chip light emitting diode (LED) package includes red, green, and blue LED chips directly bonded on a silicon substrate for a controlling integrated circuit (IC), and a carrier to which the controlling IC is attached. The multi-chip LED package has reduced volume and enhanced heat-radiating power. The chips are directly driven and controlled by the controlling IC, so that the carrier is not necessarily a printed circuit board but may be made of any solid material.

9 Claims, 4 Drawing Sheets

MULTI-CHIP LIGHT EMITTING DIODE PACKAGE

FIELD OF THE INVENTION

The present invention relates to a light emitting diode (LED) package, and more particularly to a multi-chip LED package.

BACKGROUND OF THE INVENTION

Light emitting diode (LED) is a junction diode produced with a wafer that includes a semiconductor substrate, and p-type and n-type crystalline layers formed on the substrate. After the crystalline layers are formed on the substrate, the produced wafer is cut into chips having desired dimensions. The cut chips are fixed onto a panel, wired, and packaged to produce a plurality of LED bulbs. Generally, the LED is packaged with epoxy resin.

The LED has become indispensable to modern society and may be differently designed for a variety of applications. Since the LED is generally used in lighting, warning, and visually emphasized advertising devices, it is important to effectively reduce the volume thereof and enhance its power in creating even better visual effect.

FIG. 1 is a schematic sectional view of a conventional LED package. As shown, an LED element included in this type of conventional LED package has a first lead frame 11 and a second lead frame 12. The second lead frame 12 is formed at a top with a cup-shaped recess 13, to a bottom of which an LED chip 14 is positioned and electrically connected to the first lead frame 11 via a solder wire 15. A sealing material 16 is then applied to outside of the LED element to seal the same. Typically, the sealing material 16 is a transparent material, such as epoxy resin, to allow transmission of light emitted from the LED chip 14.

In an advertising means that uses LED elements and requires colorful light sources, a plurality of LED's providing different color light sources, usually red, green, and blue LED's, must be prepared and then soldered to a circuit board according to a predetermined pattern. A control box is provided to control the on/off and flashing of the LED's. In this case, a large quantity of LED's showing different color light sources must be prepared and soldered onto the circuit board one by one. The soldering is time-consuming and a large number of soldering points increase the chances of high bad yield due to poor soldering. Thus, an illuminating device using the above-described type of LED packages has not only large volume but also high manufacturing cost.

A multi-chip LED is developed in an attempt to improve the conventional mono-chip LED that is not suitable for use on a device requiring multiple color light sources. The multi-chip LED mainly includes one single light-emitting element that is internally provided with a plurality of LED chips for producing different color light sources, including red, green, and blue light sources. That is, only one LED is enough to produce white or color light under control.

FIGS. 2 to 4 shows some examples of packaging structures for the multi-chip LED.

FIG. 2 is a schematic sectional view of a first conventional multi-chip LED package that forms one single light-emitting element. The light-emitting element includes a circuit board 21, to a top of which a plurality of, typically three, LED chips producing different color light sources are connected. The three LED chips generally include a red LED chip 22, a green LED chip 23, and a blue LED chip 24. By differently combining the color light sources from the three LED chips 22, 23, and 24 under control, white or other color light may be produced. The multi-chip LED package of FIG. 2 does not include a control unit. Therefore, an external control box must be additionally provided.

FIG. 3 is a schematic plan view of a second conventional multi-chip LED package that also forms one single light-emitting element. The light-emitting element includes a circuit board 31, to a top of which red, green, and blue LED chips 32, 33, and 34 are connected. There is also a controlling integrated circuit (IC) 35 provided on the top of the circuit board 31 and electrically connected to the three LED chips 32, 33 and 34 for controlling the on/off of the three LED chips to produce changeful color light. In the LED package of FIG. 3, the chips 32, 33, 34 and the controlling IC 35 all are located on the top of the circuit board 31 to result in a large volume of the circuit board 31.

FIG. 4 is a schematic sectional view of a third conventional multi-chip LED package that also forms one single light-emitting element. The light-emitting element includes a circuit board 41, to a top of which red, green, and blue LED chips 42, 43, and 44 are connected. A controlling IC 45 is separately provided at a bottom of the circuit board 41 and electrically connected to the three LED chips 42, 43 and 44 for controlling the on/off of the three LED chips to produce changeful color light. The LED package of FIG. 4 allows a reduced volume of the LED. However, the light-emitting element must include a printed circuit board as a carrier for the LED chips 42, 43, 44 and the controlling IC 45. In addition, since the LED chips 42, 43, 44 and the controlling IC 45 are located at the top and the bottom, respectively, of the circuit board 41, the light-emitting element could not be mass-produced on an automated machine and therefore requires more time to manufacture.

SUMMARY OF THE INVENTION

A primary object of the present invention is to provide an improved multi-chip LED package to overcome the drawbacks existed in the conventional multi-chip LED packaging structures.

To achieve the above and other objects, the present invention mainly includes red, green, and blue LED chips directly bonded on a silicon substrate for a controlling integrated circuit (IC), and a carrier to which the controlling IC is attached. The multi-chip LED package has reduced volume and enhanced heat-radiating power. The chips are directly driven and controlled by the controlling IC, so that the carrier is not necessarily a printed circuit board but may be made of any solid material, making the multi-chip LED package economical and practical for use. Moreover, the multi-chip LED package may be mass-produced on an automated machine to reduce the manufacturing cost thereof.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
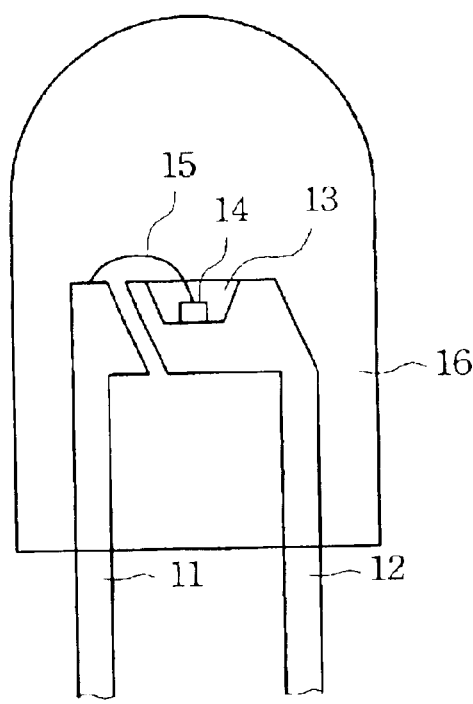
FIG. 1 is a schematic sectional view of a conventional light emitting diode (LED) package.
Figure 2:
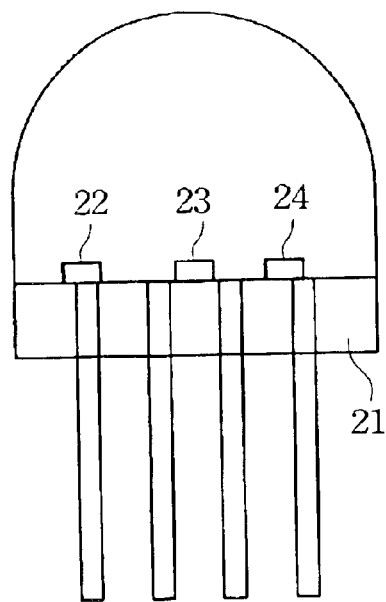
FIG. 2 is a schematic sectional view of a conventional multi-chip LED package.
Figure 3:
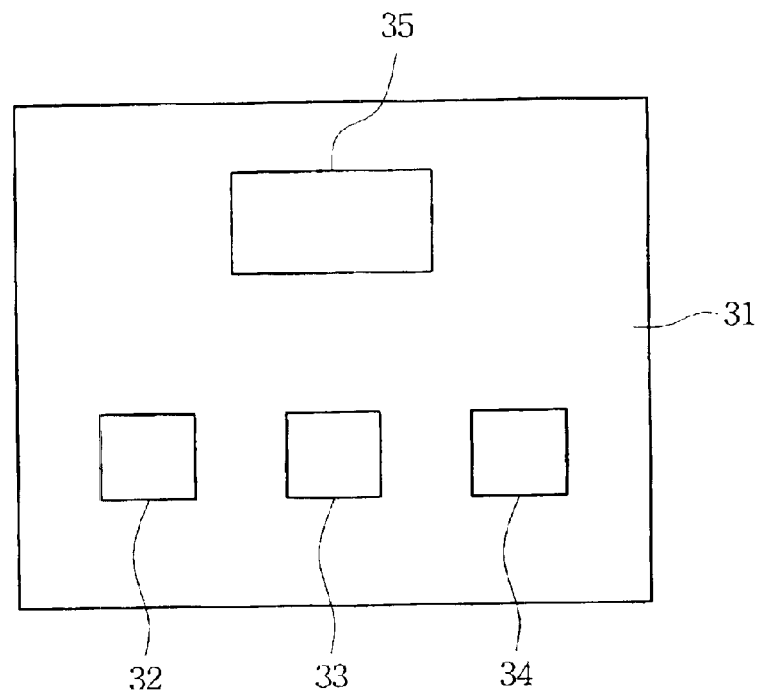
FIG. 3 is a schematic plan view of another conventional multi-chip LED package.
Figure 4:
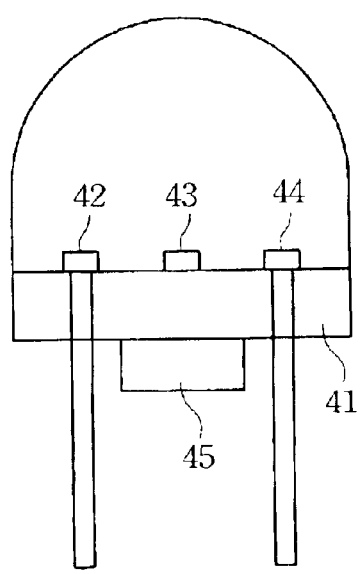
FIG. 4 is a schematic sectional view of a further conventional multi-chip LED package.
Figure 5:
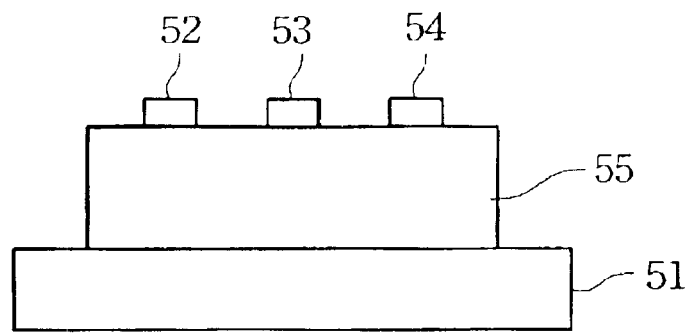
FIG. 5 is a schematic sectional view of a multi-chip LED package according to a first embodiment of the present invention.

Please refer to FIG. 5 that is a schematic sectional view of a multi-chip LED package according to a first embodiment of the present invention. In the package, there is included a plurality of LED chips, including a red LED chip 52, a green LED chip 53, and a blue LED chip 54, for producing three primary color light sources; a controlling IC 55, on a top of which the three LED chips 52, 53, and 54 are directly bonded; and a carrier 51, to a top of which the controlling IC 55 is attached. Through control of the controlling IC 55, the red, green, and blue LED chips 52, 53, and 54 may be caused to emit primary color light in different combinations to produce white or other color light.

In the multi-chip LED package of FIG. 5, the a plurality of LED chips 52, 53, 54 are directly bonded on the top of the controlling IC 55, and the controlling IC 55 is then attached to a top of the carrier 51. With these arrangements, the present invention provides at least the following advantages:
1. Since the chips 52, 53, 54 are vertically superposed on the controlling IC 55, the package occupies less space and therefore allows an increased number of light sources in a unit area of an illuminating device using the LED packages, as well as increased unit brightness and more changes in producible colors.
2. The chips 52, 53, 54 are directly bonded on the top of the controlling IC 55 to enable small impedance and enhanced heat radiating power of the LED.
3. Since the chips 52, 53, 54 are directly bonded on the controlling IC 55 and program-controllable, they may be directly driven and controlled through the controlling IC. As a result, the chips and the controlling IC are not necessarily attached to a printed circuit board as the carrier thereof. Instead, any solid carrier may be used. In other words, the carrier 51 may be a printed circuit board, a metal board, a non-metal board, an organic board, an inorganic board, a ceramic board, or any other type of solid board.
4. Since the bonding of the chips directly on the controlling IC is conducted at the same side of the carrier, the LED may be mass-produced and packaged on an automated machine to reduce the manufacturing cost thereof.

Figure 6:
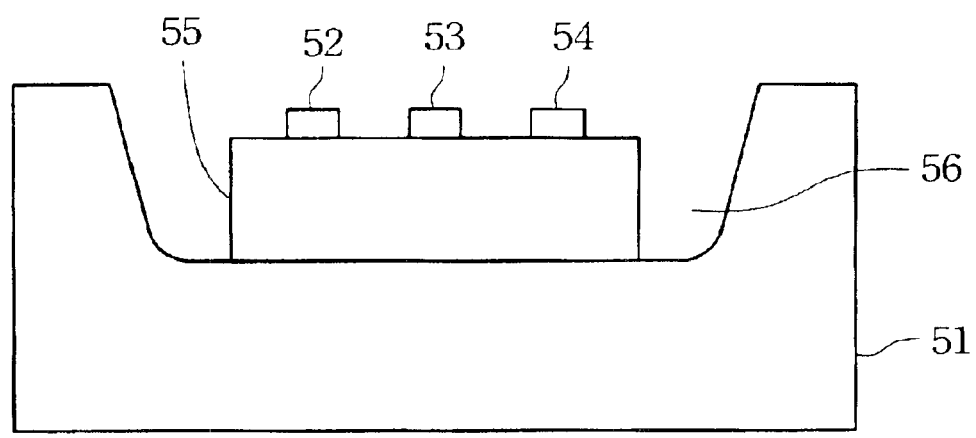
FIG. 6 is a schematic sectional view of a multi-chip LED package according to a second embodiment of the present invention.

FIG. 6 is a schematic sectional view of a multi-chip LED package according to a second embodiment of the present invention. In this second embodiment, the carrier 51 includes a cup-shaped recess 56, in which the LED chips 52, 53, 54 and the controlling IC 55 are positioned. This type of package provides a further enhanced heat radiating power and a surge proofing effect.

Figure 7:
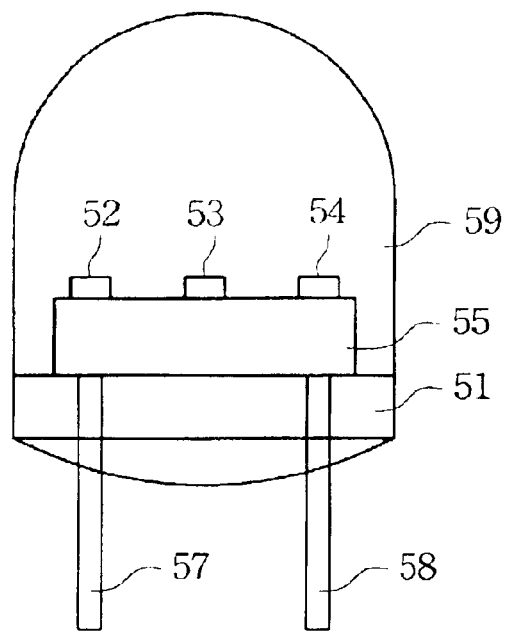
FIG. 7 is a schematic sectional view of a multi-chip LED package according to a third embodiment of the present invention.

FIG. 7 is a schematic sectional view of a multi-chip LED package according to a third embodiment of the present invention. In this third embodiment, the controlling IC 55 is located on the carrier 51 with two lead frames 57, 58 downward extended through and projected from the carrier 51 for soldering purpose, and the LED chips 52, 53, 54 are located on the top of the controlling IC 55. The carrier 51, the controlling IC 55, and the LED chips 52, 53, 54 are then sealed in a sealing material 59.

Figure 8:
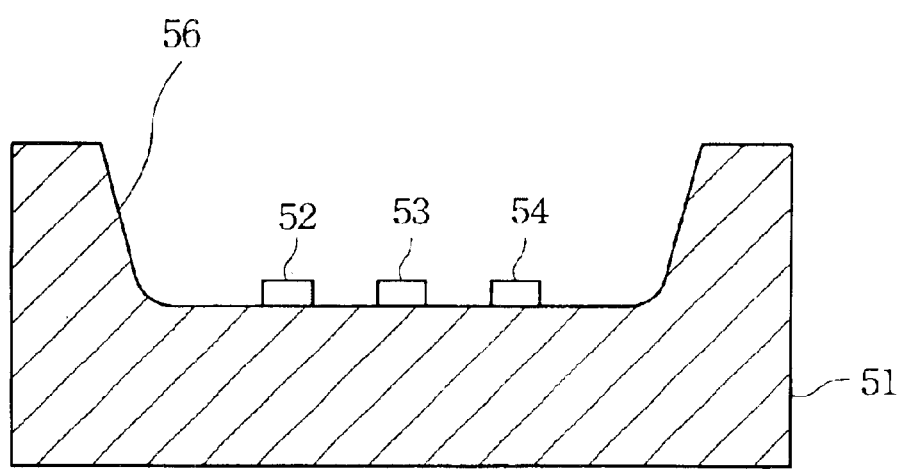
FIG. 8 is a schematic sectional view of a multi-chip LED package according to a fourth embodiment of the present invention.

FIG. 8 is a schematic sectional view of a multi-chip LED package according to a fourth embodiment of the present invention, which is a variant of the second embodiment of FIG. 6. The LED package of this variant is suitable for a case in which only white light source and big-size chips are required and therefore allows for omission of the controlling IC. In the LED package of FIG. 8, the carrier 51 includes a cup-shaped recess 56, and the LED chips 52, 53, 54 are directly bonded to the bottom of the cup-shaped recess 56. The carrier 51 is made of any metal material having a high thermal conductivity. This fourth type of multi-chip LED package also provides high radiating power and good surge proofing effect.

With the above arrangements, the multi-chip LED packages according to the present invention provide enhanced operational effect and enable mass production and accordingly reduced manufacturing cost.

The present invention has been described with some preferred embodiments thereof and it is understood that many changes and modifications in the described embodiments can be carried out without departing from the scope and the spirit of the invention as defined by the appended claims.

What is claimed is:

1. A multi-chip light emitting diode (LED) package, comprising:
   a carrier;
   a controlling integrated circuit (IC) attached to a top of said carrier; and
   a plurality of LED chips directly bonded on said controlling IC for producing different color light sources.

2. The multi-chip LED package as claimed in claim 1, wherein said plurality of LED chips includes a red LED chip, a green LED chip, and a blue LED chip.

3. The multi-chip LED package as claimed in claim 1, wherein said carrier includes a cup-shaped recess, into which said plurality of LED chips and said controlling IC are positioned.

4. The multi-chip LED package as claimed in claim 1, wherein said controlling IC includes at least two lead frames downward extended through and projected from said carrier, and said plurality of LED chips, said controlling IC, and said carrier are sealed in a sealing material.

5. The multi-chip LED package as claimed in claim 1, wherein said carrier is a printed circuit board.

6. The multi-chip LED package as claimed in claim 1, wherein said carrier is made of a metal material.

7. The multi-chip LED package as claimed in claim 1, wherein said carrier is made of a non-metal material.

8. The multi-chip LED package as claimed in claim 1, wherein said carrier is made of an organic material.

9. The multi-chip LED package as claimed in claim 1, wherein said carrier is made of an inorganic material.

* * * * *